United States Patent
Epifano

(10) Patent No.: US 10,341,160 B2
(45) Date of Patent: Jul. 2, 2019

(54) RADIO RECEIVER WITH SMART LISTENING MODE

(71) Applicant: ALi Corporation, Hsinchu (TW)

(72) Inventor: Fabio Epifano, Geneva (CH)

(73) Assignee: ALi Corporation, Hsinchu (TW)

( * ) Notice: Subject to any disclaimer, the term of this patent is extended or adjusted under 35 U.S.C. 154(b) by 0 days.

(21) Appl. No.: 15/595,223

(22) Filed: May 15, 2017

(65) Prior Publication Data

US 2018/0331877 A1    Nov. 15, 2018

(51) Int. Cl.
| H04L 27/34 | (2006.01) |
| H03G 3/30 | (2006.01) |
| H04J 3/02 | (2006.01) |
| H04B 1/06 | (2006.01) |
| H04L 27/22 | (2006.01) |
| H04L 27/38 | (2006.01) |

(52) U.S. Cl.
CPC ....... H04L 27/3405 (2013.01); H03G 3/3052 (2013.01); H03G 3/3078 (2013.01); H04B 1/06 (2013.01); H04J 3/025 (2013.01); H04L 27/22 (2013.01); H04L 27/38 (2013.01)

(58) Field of Classification Search
CPC .......... H04L 27/3405; H03G 3/3052; H03G 3/3078; H03G 3/3068; H03G 3/001; H04J 3/025
See application file for complete search history.

(56) References Cited

U.S. PATENT DOCUMENTS

| 3,110,028 A | * | 11/1963 | Noyes, Jr. | G01S 1/02 342/407 |
| 7,522,677 B2 | | 4/2009 | Liang | |
| 2002/0099966 A1 | * | 7/2002 | Cabler | G06F 1/3209 713/323 |
| 2003/0031230 A1 | * | 2/2003 | Kwon | H04B 1/7093 375/130 |
| 2004/0152418 A1 | * | 8/2004 | Sinha | H04L 27/0002 455/42 |
| 2004/0253955 A1 | * | 12/2004 | Love | H04B 7/0814 455/442 |
| 2007/0194959 A1 | * | 8/2007 | Rueckriem | H03G 3/3052 341/118 |
| 2008/0227421 A1 | * | 9/2008 | Balakrishnan | H04B 1/0039 455/233.1 |
| 2009/0003469 A1 | * | 1/2009 | Gunturi | H04L 27/2657 375/260 |

(Continued)

Primary Examiner — Jean B Corrielus
(74) Attorney, Agent, or Firm — J.C. Patents

(57) ABSTRACT

The embodiments of the disclosure introduce a novel receiver having a smart listening mode for reducing the current consumption of a receiver while waiting for a data packet. In the smart listening mode, the receiver temporarily disables one signal path of a quadrature signal (e.g., I or Q path) until the receiver detects an arrival of data packet via a second signal path of the quadrature signal. The receiver continuously monitors the enabled signal path for the incoming data packet via in-channel energy. After the incoming data packet is detected, it is further determined whether the incoming data packet is a valid data packet. If not, one of the signal paths would be disabled again. As a result, the current consumption of the receiver is reduced while waiting for an incoming data packet.

15 Claims, 4 Drawing Sheets

(56) References Cited

U.S. PATENT DOCUMENTS

| | | | |
|---|---|---|---|
| 2009/0080501 A1* | 3/2009 | Kim | G01S 13/82 375/211 |
| 2011/0148672 A1* | 6/2011 | Domingo | G06F 1/3278 341/50 |
| 2012/0082271 A1* | 4/2012 | Elenes | H04H 20/30 375/343 |
| 2013/0155920 A1* | 6/2013 | Lim | H04W 4/12 370/310 |
| 2014/0226701 A1* | 8/2014 | Pennisi | H04L 1/02 375/219 |
| 2014/0376651 A1* | 12/2014 | Khoury | H03D 1/04 375/261 |
| 2016/0233580 A1* | 8/2016 | Aparin | H01Q 3/267 |
| 2016/0277177 A1* | 9/2016 | de Ruijter | H04L 7/042 |
| 2018/0183636 A1* | 6/2018 | Ganesan | H04L 27/06 |

* cited by examiner

RADIO RECEIVER WITH SMART LISTENING MODE

BACKGROUND

Technical Field

The invention relates a radio frequency (RF) receiver, and more particularly, relates to a RF receiver having a smart listening mode.

Description of Related Art

In a communication system, data are being exchanged between a transmitting end and a receiving end, where the data is carried by a RF signal. When quadrature modulation is utilized to transmit the data in a communication system, the transmitting end modulates signal carrying the data into an in-phase (I) and a quadrature-phase (Q) signal components that are offset by 90 degrees in phase. The two signal components are then superposed to generate a RF signal for transmission. At the receiving end, a receiver receives the RF signal via an antenna and performs demodulation to obtain information carried by the RF signal. For the demodulation, the receiver has to provide two separate signal channels (or paths), such as I channel and Q channel. In each channel, the RF signal may be filtered, amplified, processed in order to obtain signal characteristic and convert the RF signal into digital data.

Since the receiving end does not know the timing of the data transmission, the receiver would be activated, waiting for a data packet. This activation of the receiver would consume an amount of power. Furthermore, the antenna is exposed to various RF signals propagating in the open air, so the receiver would also process these RF signals. However, some of these RF signals are not directed to a device at the receiving end. The process performed for these RF signals would also consume power. Therefore, it is desirable to reduce the power consumption while waiting for a valid data packet to arrive.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The disclosure is directed to a radio frequency (RF) receiver and a method of processing the RF signal, which reduces the current consumption while waiting for data packet to arrive.

According to one of the exemplary embodiments, the disclosure is directed to a receiver receiving a radio frequency (RF) signal. The receiver includes a mixer, a first path circuit, and a second path circuit. The mixer mixes the RF signal to generate a first signal and a second signal based on a local frequency. The second signal has a phase shift of 90 degrees with respect to the first signal. The first path circuit processes and transmits the first signal. The second path circuit processes and transmits the second signal. While waiting for data packet to arrive, the second path circuit is configured to be disabled prior to a detection of data packet being carried by the RF signal.

According to one of the exemplary embodiments, the receiver further includes a data packet detection circuit coupled to the first and second path circuits. The data packet detection circuit continuously monitors the first path circuit for an incoming data packet via an in-channel energy detection, outputs a control signal to enable the second path circuit based at least in part on an energy level detected on the first path circuit, and enables the second path circuit based on the control signal.

According to one of the exemplary embodiments, the data packet detection circuit outputs the control signal to enable the second path circuit when the energy level detected on the first path circuit is greater than a predetermined threshold.

According to one of the exemplary embodiments, the data packet detection circuit further determines whether the incoming data packet carried by the first and second signals is a valid data packet by a signal correlation. If the data packet detection circuit determines that the incoming data packet is not a valid data packet, the data packet detection circuit outputs the control signal to disable the second path circuit.

According to one of the exemplary embodiments, the first and second path circuits each includes a low pass filter (LPF), an amplifier, and a first analog-to-digital converter, which are connected in series.

According to one of the exemplary embodiments, the receiver further includes an automatic gain control (AGC). The AGC is coupled to the first and second amplifiers to dynamically adjust the gain of the first and second amplifiers, wherein the gain is set to maximum when the second path circuit is disabled.

According to one of the exemplary embodiments, the disclosure is directed to a method of processing a RF signal, which is adapted to a receiver. Firstly, the RF signal is converted into a first signal and a second having a phase shift of 90 degrees with respect to the first signal. The first signal is being conveyed via a first signal path, while a second signal path coupled to the second signal is disabled prior to a detection of data packet being carried by the first signal on the first signal path.

According to one of the exemplary embodiments, the receiver continuously monitors the first signal path for the incoming data packet by detecting an in-channel level on the first signal path. Based on the in-channel energy level detected on the first signal path, the second signal path is enabled to convey the second signal via a control signal.

According to one of the exemplary embodiments, the second signal path is enabled when the in-channel energy level detected on the first signal path is greater than a predetermined threshold.

According to one of the exemplary embodiments, after the second path is enabled, a determination of whether the incoming data packet carried by the first and second signals is a valid data packet is performed via a signal correlation. If it is determined that the incoming data packet is not a valid data packet, the second signal path is disabled.

According to one of the exemplary embodiments, the gain of the amplifiers on the first and second paths are set to maximum when the second signal path is disabled.

Based on the above, the receiver temporarily disables one of the signal paths until the receiver detects an arrival of data packet via another signal path. When an incoming data packet is detected, the receiver further determines whether the incoming data packet is a "valid" data packet or not. If not, the receiver would disable one of the signal path again and continuously monitor another signal path for arrival of data packet. Furthermore, the gain of the voltage gain amplifier disposed on the signal path is set to maximum so as to broaden the power level range to which the receiver may detect. Since one of the signal paths is disabled while waiting for incoming data packet, the current consumption may be reduced during a listening mode of the receiver.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
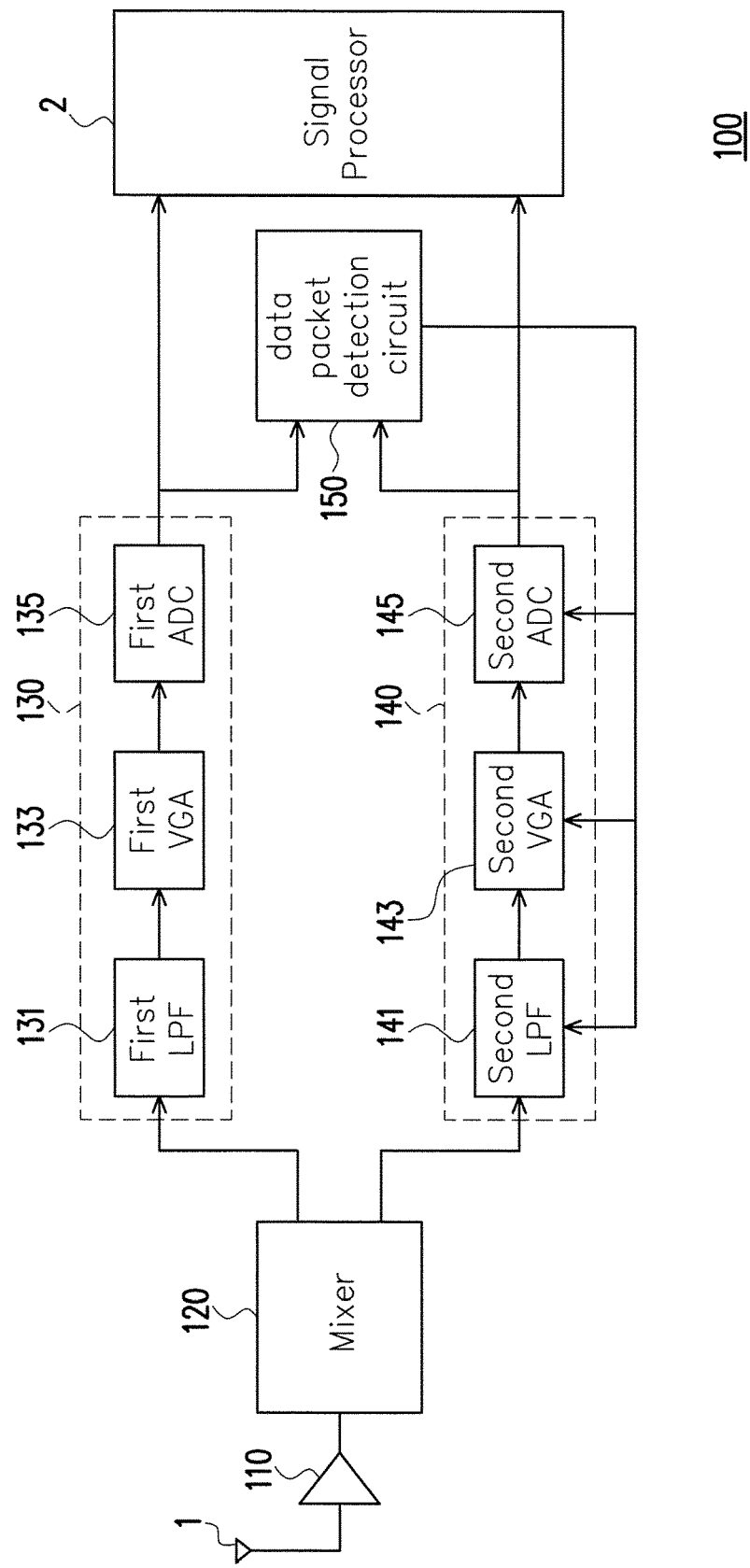
FIG. 1 is a block diagram illustrating a radio frequency (RF) receiver having a smart listening mode according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

As described above, a radio frequency (RF) receiver is activated at all time since the arrival of data packet is unknown. This activation would consume power since various elements in the RF receiver would be activated. Exemplary embodiments are described below to illustrate a RF receiver having a smart listening mode to reduce the current consumption. In the smart listening mode, some of the elements of the RF receiver are disabled or deactivated while waiting for data packet.

FIG. 1 is a block diagram illustrating a RF receiver 100 having a smart listening mode according to an embodiment of the disclosure. With reference to FIG. 1, the receiver 100 includes a low noise amplifier (LNA) 110, a mixer 120, a first signal path (also referred to as first path circuit) 130, a second signal path (also referred to as second path circuit) 140, and a data packet detection circuit 150. In the embodiment, a RF signal is received via the antenna 1, and then fed into the receiver 100. In the receiver 100, the RF signal is coupled to the LNA 110 via an optional bandpass filter (not shown). The output of the LNA is coupled to the mixer 120, where the mixer 120 generates a first signal and a second signal based on the RF signal. The first and second signals are then fed in parallel to the first and second signal paths (or path circuits) 130, 140, respectively, and information carried by the first and second signals can be processed and delivered to the data packet detection circuit 150 and a signal processor 2 for further processing.

In one of the embodiments of the disclosure, the received RF signal is a quadrature signal, and the first and second signals are I and Q components of the quadrature signal, where the Q component have a phase shift of 90 degrees with respect to the I component. It should be noted that the first and second signals are utilized for the purpose of description. The first signal may be referred to as the I (or Q) component of the RF signal, and the second signal is referred to as the Q (or I) component of the RF signal.

In the embodiment, power of the receiver 100 may be preserved by disabling either the first or second signal path, while waiting for data packet to arrive. In other words, one of the signal paths would be disabled, allowing a portion of the RF signal to pass via another signal path. The enabled signal path (e.g., first signal path 130) would deliver the received signal to the data packet detection circuit 150 where the validity of the received signal is checked. If the data packet detection circuit 150 detects that the received signal carries a valid data packet, the disabled signal path (e.g., second signal path 140) would be enabled or activated to process another component of the RF signal and transmit it to the data packet detection circuit 150 and the signal processor 2 for further processing.

Data packet may be detected based on the energy level, characteristic and property of the received RF signal. For example, the data packet detection circuit 150 may detect an arrival of data packet based on energy detection, such as received signal strength indicator (RSSI). Then, the received data packet may be determined to be "valid" via a signal correlation. The data packet carried by a received RF signal is determined to be "valid" data packet if the data packet is designated for a device to which the receiver 100 belongs. Further description of the data packet detection would be described later.

In the following, the elements of the receiver 100 would be described in detail.

With reference to FIG. 1, the mixer 120 mixes the received RF signal with a local frequency to generate the first and second signals. In other words, the mixer 120 samples the received RF signal with a first local frequency and a second local frequency having a 90 degree phase shift with respect to the first local frequency.

Figure 2:
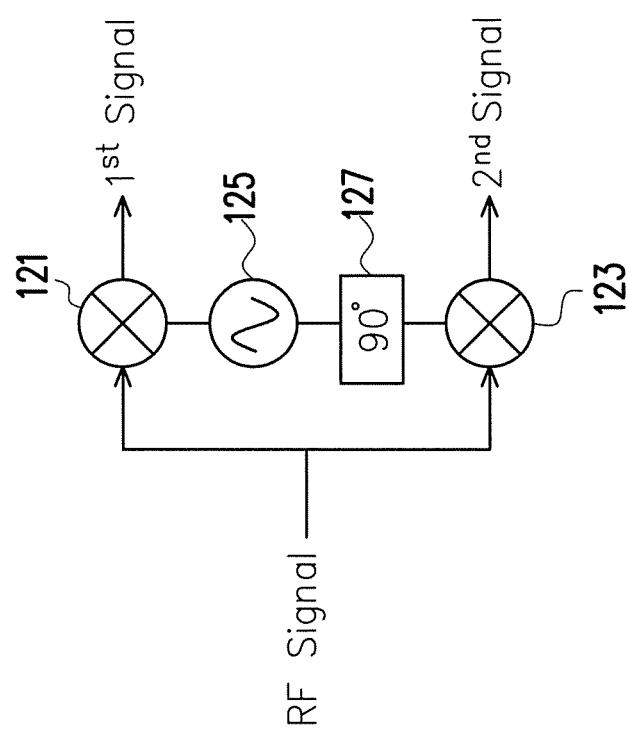
FIG. 2 is a block diagram illustrating a mixer according to an embodiment of the disclosure.

FIG. 2 is a block diagram illustrating the mixer 120 according to an embodiment of the disclosure. With reference to FIG. 2, the mixer 120 includes a first mixer 121, a second mixer 123, a local oscillator 125 and a phase shifter 127. The first and second mixers 121, 123 respectively receives the RF signal via the LNA 110. On one hand, the mixer 121 mixes the RF signal with the local frequency signal directly received from the local oscillator 125 and outputs the first signal. On the other hand, the mixer 123 mixes the RF signal with the local frequency signal received from the local oscillator 125 via the phase shifter 127 and outputs the second signal, where the phase shifter 127 shifts the frequency signal of the local oscillator 125 by 90 degrees. The output of the first and second mixers 121, 123 are coupled to the first and second signal paths 130, 140, respectively, which transmits the first and second signals to the first and second signal paths in parallel.

The disclosure is not limited to the structure of mixer 120 described above. In other embodiments of the disclosure, the mixer 120 may be implemented by a frequency converter, such as up/down frequency converter. The frequency converter may include a switch and a local oscillator. The frequency converter converts the RF signal into a first signal and a second signal, where the switch is controlled by a local frequency to sample the RF signal.

In the embodiment, the first signal path 130 transmits the first signal to the data packet detection circuit 150 and the signal processor 2. The second signal path 140 transmits the second signal to the data packet detection circuit 150 and the signal processor 2. In detail, the first signal path 131 includes a first low pass filter (LPF) 131, a first voltage gain amplifier (VGA) 133, and a first analog to digital converter (ADC) 135, which are connected in series. In the first signal path 130, the first signal is filtered by the first LPF 131, amplified by first VGA 133, and converted into a first digital signal by the first ADC 135. The first digital signal is then input to the data packet detection circuit 150 and the signal processor 2 for further processing.

The second signal path 140 includes a second LPF 141, a second VGA 143, and a second ADC 145, which are connected in series. In the second signal path 140, the second signal is filtered by the second LPF 141, amplified by second VGA 143, and converted into a second digital signal by the second ADC 145. The second digital signal is then input to the data packet detection circuit 150 and the signal processor 2 for further processing.

The data packet detection circuit 150 is connected to the outputs of the first and second signal paths, where the data packet detection circuit 150 monitors the first and second signal paths for any valid data packet that has a clear indication of valid signal strength and being designated to the device to which the receiver 100 belongs to. With reference to FIG. 1, the data packet detection circuit 150 is connected to each element of the second signal path 140 (e.g., the second LPF 141, the second VGA 143, and the second ADC 145), respectively. According to the result of the data packet detection, the data packet detection circuit 150 may output a control signal to enable or disable the elements disposed on the second signal path 140.

In a normal operation mode, both of the first and second signal paths 130, 140 are enabled to convey both of the I and Q components of the RF signal to the signal processor 2. In the smart listening mode, the data packet detection circuit 150 would disable the elements disposed on the second signal path 140, leaving the first signal path 130 enabled for conveying a portion of the RF signal to the data packet detection circuit 150, for example, the I component of the RF signal. It should be noted that the portion of the RF signal would contain sufficient information for the data packet detection circuit 150 to detect an incoming data packet, or in other words, determining whether the received RF signal contains a data packet. For example, the smart listening mode of the receiver 100 may be initiated when it is determined that no transmission activities was made for a period of time, such as 30 seconds, 1 minutes, 10 minutes, etc. However, the disclosure is not intended to limit time conditions that enable the receiver 100 to enter the smart listening mode. For the purpose of illustration, it is assumed the receiver 100 is initially operated in the smart listening mode where the second signal path 140 is disabled.

In the following, the data packet detection during the smart listening mode would be described in detail. In the smart listening mode, an in-channel energy on the first signal path 130 would be continuously monitored. Upon the arrival of data packet, the data packet detection circuit 150 would detect the in-channel energy on the first signal path 130 caused by the first signal, and then enable the second signal path 140 by transmitting the control signal to each element disposed on the second signal path 140. In detail, the data packet detection circuit 150 may compare the received in-channel energy with a predetermined threshold. If the in-channel energy is greater than the predetermined threshold, the data packet detection circuit 150 determines that the receiver 100 is receiving a data packet. Upon detection of data packet, the second signal path 140 is enabled to convey another portion of the RF signal (e.g., Q component) to the data packet detection circuit 150 for further processing.

The predetermined threshold may be fixed or dynamically adjusted. The predetermined threshold may be preconfigured to a fixed value. However, in an embodiment of the disclosure, the predetermined threshold may be dynamically adjusted according to the in-channel energy level of previous transmission.

After the second signal path 140 is enabled, the data packet detection circuit 150 may perform a fine power measurement and a determination of whether the received RF signal contains a valid data packet. In the determination of whether the received signal contains a valid data packet, the data packet detection circuit 150 may perform a signal correlation (e.g., autocorrelation or cross-correlation) on the digital signals to determine whether the RF signal is designated for the receiver 100. In an example of Bluetooth and WIFI communications, the property of the signal would be different between Bluetooth and WIFI communications. In detail, WIFI signal utilizes 20 MHz, 40 MHz, 80 MHz, or 160 MHz to transmit signals, while Bluetooth signal utilizes 1 MHz or 2 MHz. As mentioned above, the property of the RE signal may be extracted and converted into digital signals. The data packet detection circuit 150 may determine whether the data packet carried by the RF signal is a valid data packet by performing the signal correlation on the digital signals. If the receiver 100 is configured to receive WIFI signal, a RF signal transmitted in Bluetooth configuration would have different signal property. Under such scenario, the RF signal would be determined as a signal that does not contain a "valid" data packet. On the contrary, if a RF signal transmitted in WIFI configuration, such RF signal would be determined as a signal that contains a valid data packet.

In one of the embodiments of the disclosure, the data packet detection circuit 150 further performs the signal correlation on a preamble of the received signal, as to determine whether the received signal contains a "valid" data packet. For example, the preamble of Bluetooth signal would be configured in Gaussian frequency-shift keying (GFSK), while the WIFI signal would be configured with a special Orthogonal frequency-division multiplexing (OFDM) symbol. With this differences in the preamble of the WIFI and Bluetooth signal, the data packet detection circuit 150 may differentiate different type of wireless communication and determines whether the received signal contains a "valid" data packet.

In other embodiments of the disclosure, the preamble of the signal is further utilized to determine whether the received signal is designated to the receiver 100. It is known that various signals propagate in the open air, however, not all of these signals are designated to the receiver 100. Even though the received signal has signal property to which the receiver 100 is configured to receive, the data packet contained in the received signal may not be designated to the receiver 100. The preamble of a signal identifies a destination of signal. That is, the preamble includes information that identifies a device acting as the receiving end of the signal. In the embodiment, the receiver 100 determines whether a received signal contains a valid data packet by performing a signal correlation on the preamble of the received signal. If the preamble indicates that data packet is designated to the receiver 100, the data packet detection circuit 150 then determines that the received data packet is a valid data packet.

Based on the above, a "valid" data packet is defined as data packet that has signal property or characteristic complying with a receiver or a preamble identifying the receiver as its destination. It should be noted that the disclosure is not intended to limit the embodiments described above. Various signal characteristics and properties may be utilized as to determine that the received data packet is a "valid" data packet.

Next, if it is determined that the received data packet is a "valid" data packet, the data packet detection circuit 150 would continue to enable the second signal path 140, which allows the receiver 100 operate in the normal operation mode where both of the first and second signals of the RF signal are being conveyed to the signal processor 2 for further processing. On the other hand, if it is determined that the received data packet is not a "valid" data packet, the data packet detection circuit 150 would disable the second signal path 140 via the control signal, which configures the receiver 100 in the smart listening mode.

Based on the above, the exemplary receiver 100 would be able to preserve power via the smart listening mode. The second signal path 140 of the receiver 100 may be temporally disabled before the data packet detection circuit 150 detects a "valid" data packet, so that the components disposed on the second signal path 140 would not drain power while waiting for data packet to arrive.

Figure 3:
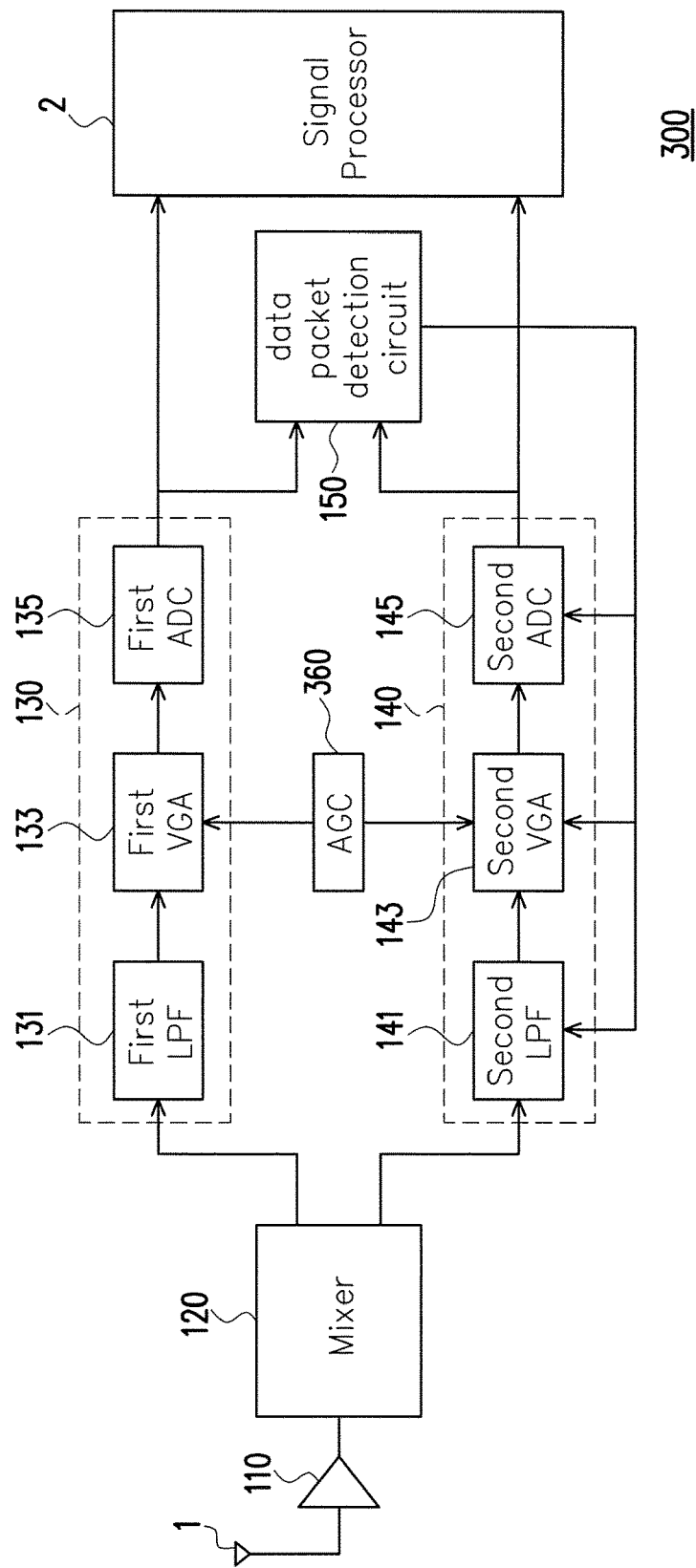
FIG. 3 is a block diagram illustrating a receiver according to one of the embodiments of the disclosure.

FIG. 3 is a block diagram illustrating a receiver according to one of the embodiments of the disclosure. With reference to FIG. 3, a receiver 300 is similar to the receiver 100 illustrated in FIG. 1. One of the difference is that the receiver 300 further includes an automatic gain control (AGC) 360. The AGC 360 is coupled to the first VGA 133 and/or the second VGA 143 to dynamically adjust the gain of the first and second VGAs 133, 143. This would broaden the power range which the receiver 300 may detect. Generally, the input power range may be defined as a low power range, a mid power range, and a high power range. The AGC 360 increases the gain of the first and second VGAs 133,143, so that it would be easier to detect the in-channel energy. In the smart listening mode, the AGC 360 adjusts the gain of the first and second VGAs 133, 143 to the maximum. Since the gain is increased to maximum, the sensitivity at the low power range may be raised. In other words, the data packet detection circuit 150 may detect a signal having a lower power level since the gains of the first and second VGAs 133, 143 are set to maximum, making the signal having low power level easier to detect. While the gain is set to the maximum, the delay added for the enabling the second signal path 140 would not be an issue. In detail, if the signal is in lower power range, the gain would not be changed. If the signal is either in mid or high power range, the in-channel energy would quickly raise above the threshold and enabling the second signal path 140. In one of the embodiments of the disclosure, the AGC 360 is also coupled to the LNA 110 to adjust the gain of the LNA 110.

Figure 4:
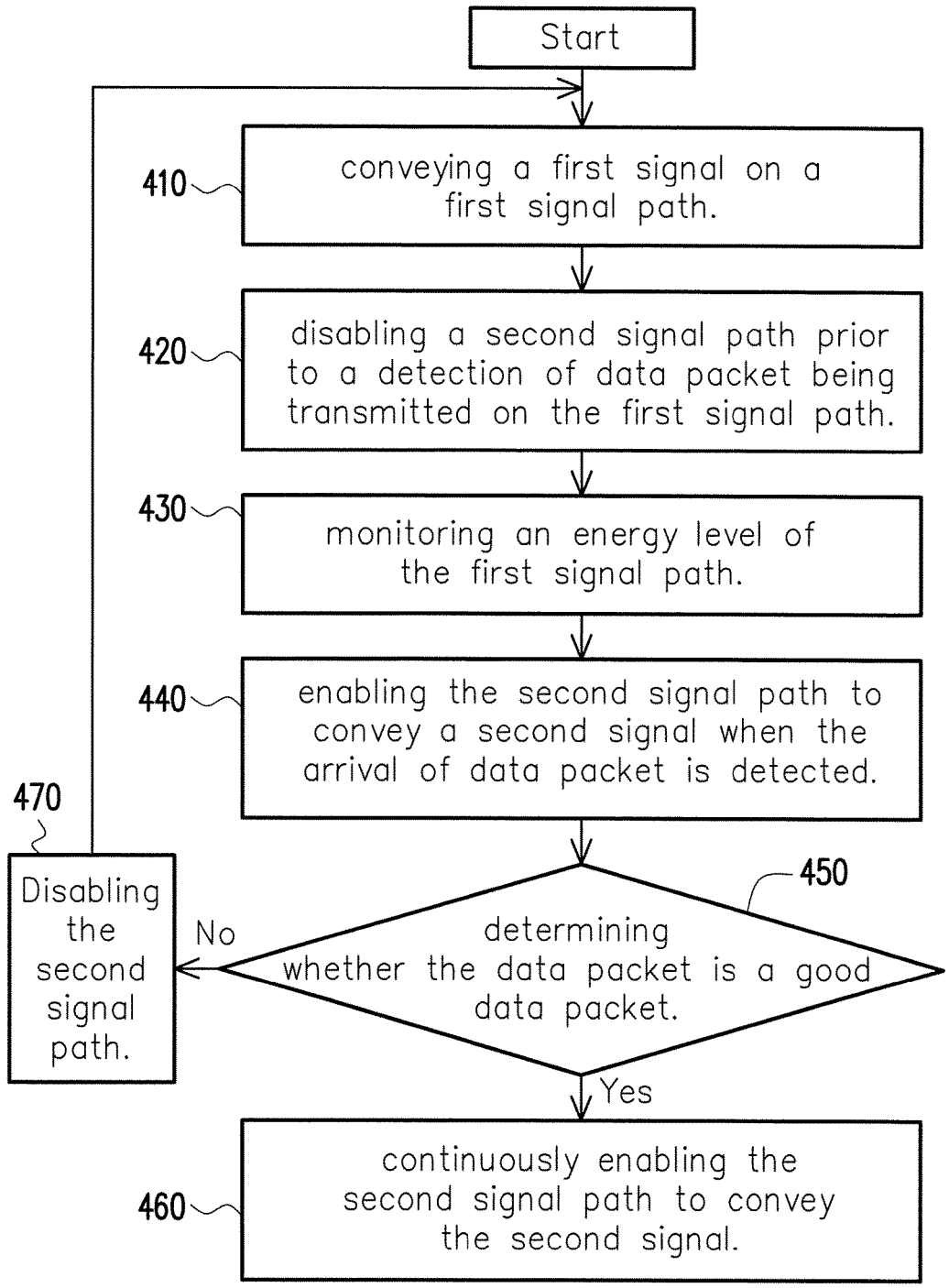
FIG. 4 is a flow diagram illustrating a process for handling a received RF signal according to an embodiment of the disclosure.

FIG. 4 is a flow diagram illustrating a process for handling a received RF signal according to an embodiment of the disclosure. In the embodiment, the received RF signal is converted into a first signal and a second signal according to a local frequency, where the second signal has a phase shift of 90 degrees with respect to the first signal.

In step S410, the first signal is being conveyed or transmitted to a data packet detection circuit 150 via a first signal path. In step S420, the second signal path is disabled before a detection of data packet being transmitted on the first signal path. In one of the embodiments, the receiver may be initially configured in a smart listening mode where a second signal path is disabled.

In the smart listening mode, only the first signal path is enabled to convey the first signal, while the second signal path is disabled. In step S430, the energy level of the first signal path is being continuously monitored during the smart listening mode. In detail, the data packet detection circuit would detect an in-channel energy caused by the first signal upon the arrival of data packet carried by the RF signal.

In step S440, when the arrival of data packet is detected, the data packet detection circuit would output a control signal to enable the second signal path to transmit the second signal to the data packet detection circuit for further determination.

Then, in step S450, the data packet detection circuit determines whether the incoming data packet is a "valid" data packet. If yes, the second signal path would remain enabled (step S460.) If no, the second signal path would be disabled again (step S460,) and the process would go back to the beginning.

In summary, the embodiments of the disclosure introduce a novel receiver having a smart listening mode for reducing the current consumption of a receiver while waiting for data packet. The receiver temporarily disables one signal path (I or Q path of a quadrature signal) until the receiver detects an arrival of data packet via another signal path (Q or I path of a quadrature signal). When an incoming data packet is detected, the receiver further determines whether the incoming data packet is a "valid" data packet or not. If not, the receiver would disable one of the signal path again and continuously monitor another signal path for arrival of data packet. Furthermore, the gain of the voltage gain amplifier disposed on the signal path is set to maximum so as to broaden the power level range to which the receiver may detect.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

Embodiments of the present disclosure may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together. It is to be noted that the term "a" or "an" entity refers to one or more of that entity. As such, the terms "a" (or "an"), "one or more" and "at least one" can be used interchangeably herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A receiver, receiving a radio frequency (RF) quadrature signal, comprising:
 a mixer, mixing the RF quadrature signal to generate an in-phase signal and a quadrature-phase signal based on a local frequency;
 a first path circuit, processing and transmitting the in-phase signal, wherein the first path circuit comprises:
  a first low pass filter, receiving the in-phase signal from the mixer;
  a first amplifier, coupled to the output of the first low pass filter; and
  a first analog-to-digital converter, coupled to the first amplifier, and converting the in-phase signal to a first digital signal;
 a second path circuit, processing and transmitting the quadrature-phase signal, wherein the second path circuit comprises:
  a second low pass filter, receiving the quadrature-phase signal from the mixer;
  a second amplifier, coupled to the output of the second low pass filter; and
  a second analog-to-digital converter, coupled to the second amplifier, and converting the quadrature-phase signal to a second digital signal;
 a signal processor, coupled to the first and second path circuits to receive both the first and second digital signals for signal processing;
 an automatic gain control, coupled to the first and second amplifiers, and dynamically adjusting the gain of the first and second amplifiers; and
 a data packet detection circuit, coupled to the first and second path circuits, continuously monitoring the first path circuit for an incoming data packet via an in-channel energy detection, and outputting a control signal to enable or disable the second path circuit based at least in part on an energy level detected on the first path circuit,
 wherein the data packet detection circuit is coupled to the first path circuit to receive the first digital signal directly from the first analog-to-digital converter and is coupled to the second path circuit to receive the second digital signal directly from the second analog to digital converter, and
 wherein the control signal is provided directly to each of the second low pass filter, the second amplifier and the second analog-to-digital converter to enable or disable the second signal path,
 wherein the second path circuit is configured to be disabled by the data packet detection circuit prior to a detection of the incoming data packet being carried by the RF quadrature signal on the first path circuit,
 wherein the gain is set to maximum when the second path circuit is disabled.

2. The receiver of claim 1,
 wherein the quadrature-phase signal has a phase shift of 90 degrees with respect to the in-phase signal.

3. The receiver of claim 2, wherein the data packet detection circuit outputs the control signal to enable the second path circuit when the energy level detected on the first path circuit is greater than a predetermined threshold.

4. The receiver of claim 2, wherein the data packet detection circuit further determines whether the incoming data packet carried by the in-phase and quadrature-phase signals is a valid data packet by a signal correlation.

5. The receiver of claim 4, wherein if the data packet detection circuit determines that the incoming data packet is not a valid data packet, the data packet detection circuit outputs the control signal to disable the second path circuit.

6. A method for processing a radio frequency (RF) quadrature signal, adapted to a receiver, comprising:
 receiving the RF quadrature signal;
 converting the RF quadrature signal into an in-phase signal and a quadrature-phase signal according to a local frequency;
 conveying the in-phase signal on a first signal path to a signal processor, wherein first signal path comprises a first low pass filter to filter the in-phase signal, a first amplifier to amplify an output of the first low pass filter, and a first analog-to-digital converter, and an output of the first amplifier is converted to a first digital signal by the first analog-to-digital converter;
 conveying the quadrature-phase signal on a second signal path to the signal processor, wherein the second signal path comprises a second low pass filter to filter the quadrature signal, a second amplifier to amplify an output of the second low pass filter, and a second analog-to-digital converter, and an output of the second amplifier is converted to a second digital signal by the second analog-to-digital converter;
 providing an automatic gain control, coupled to the first and second amplifiers, to dynamically adjust the gain of the first and second amplifiers;
 continuously monitoring, by a data packet detection circuit, the first signal path for an incoming data packet via an in-channel energy detection and outputting a control signal to enable or disable the second signal path based at least in part on an energy level detected on the first signal path, wherein the data packet detection circuit directly receives the first digital signal from the first analog-to-digital converter as to detect in-channel energy of the first signal path;
 enabling the second signal path in response to the detection of the incoming data packet on the first signal path based on the control signal by directly providing the control signal to each of the second low pass filter, the second amplifier and the second analog-to-digital converter from the data packet detection circuit;
 disabling the second signal path coupled to the quadrature-phase signal prior to a detection of an arrival of the incoming data packet being carried by the RF quadrature signal on the first signal path;
 setting the gain of the first amplifier and the gain of the second amplifier to maximum when the second signal path is disabled; and
 performing a signal processing to the in-phase and quadrature-phase signals of the RF quadrature signal by the signal processor.

7. The method of claim 6,
 wherein the quadrature-phase signal has a phase shift of 90 degrees with respect to the in-phase signal.

8. The method of claim 7, wherein the control signal is output when the in-channel energy level detected on the first signal path is greater than a predetermined threshold.

9. The method of claim 7, further comprising determining whether the incoming data packet carried by the in-phase and quadrature-phase signals is a valid data packet via a signal correlation.

10. The method of claim 9, further comprising disabling the second signal path if it is determined that the incoming data packet is not a valid data packet.

11. A wireless communication apparatus, receiving a radio frequency (RF) quadrature signal, comprising:

a signal processor, configured to process the RF quadrature signal;

a down-converter, receiving and converting the RF quadrature signal into a first signal carrying in-phase signal component of the RF quadrature signal and a second signal carrying quadrature-phase signal component of the RF quadrature signal based on a local frequency;

a first signal path, coupled to the down-converter, and transmitting the first signal from the down-converter to the signal processor, wherein the first signal path comprises:
- a first low pass filter, receiving the first signal from the down-converter;
- a first amplifier, coupled to the output of the first low pass filter; and
- a first analog-to-digital converter, coupled to the first amplifier, and digitizing the first signal to produce a first digital signal;

a second signal path, coupled to the down-converter, and transmitting the second signal from the down-converter to the signal processor, wherein the second signal path comprises:
- a second low pass filter, receiving the second signal from the down-converter;
- a second amplifier, coupled to the output of the second low pass filter; and
- a second analog-to-digital converter, coupled to the second amplifier, and digitizing the second signal to produce a second digital signal; and an automatic gain control, coupled to the first and second amplifiers, and dynamically adjusting the gain of the first and second signals; and a data packet detection circuit, coupled to the first and second signal paths, continuously monitoring the first signal path for an incoming data packet via an in-channel energy detection, and outputting a control signal to enable or disable the second signal path based at least in part on an energy level detected on the first signal path, wherein the data packet detection circuit is coupled to the first signal path to receive the first digital signal directly from the first analog-to-digital converter and is coupled to the second signal path to receive the second digital signal directly from the second analog to digital converter, wherein the control signal is provided directly to each of the second low pass filter, the second amplifier and the second analog-to-digital converter to enable or disable the second signal path, wherein the second signal path is configured to be disabled by the data packet detection circuit prior to a detection of the incoming data packet being carried by the RF quadrature signal on the first signal path, wherein the gain is set to maximum when the second signal path is disabled.

12. The wireless communication apparatus of claim 11, wherein the second signal has a phase shift of 90 degrees with respect to the first signal.

13. The wireless communication apparatus of claim 12, wherein the data packet detection circuit outputs the control signal to enable the second signal path when the energy level detected on the first signal path is greater than a predetermined threshold.

14. The wireless communication apparatus of claim 12, wherein the data packet detection circuit further determines whether the incoming data packet carried by the first and second signals is a valid data packet by a signal correlation.

15. The wireless communication apparatus of claim 14, wherein if the data packet detection circuit determines that the incoming data packet is not a valid data packet, the data packet detection circuit outputs the control signal to disable the second signal path.

* * * * *